(12) United States Patent
Lin et al.

(10) Patent No.: US 10,510,931 B2
(45) Date of Patent: Dec. 17, 2019

(54) SIDE-VIEW LIGHT EMITTING DIODE PACKAGE STRUCTURE

(71) Applicant: ADVANCED OPTOELECTRONIC TECHNOLOGY, INC., Hsinchu Hsien (TW)

(72) Inventors: Hou-Te Lin, Hsinchu (TW); Yi-Sen Lin, Hsinchu (TW); Chin-Fu Cheng, Hsinchu (TW); Wen-Liang Tseng, Hsinchu (TW); Pin-Chuan Chen, Hsinchu (TW)

(73) Assignee: ADVANCED OPTOELECTRONIC TECHNOLOGY INC., Hsinchu Hsien (TW)

( * ) Notice: Subject to any disclaimer, the term of this patent is extended or adjusted under 35 U.S.C. 154(b) by 0 days.

(21) Appl. No.: 15/972,240

(22) Filed: May 7, 2018

(65) Prior Publication Data

US 2019/0319173 A1    Oct. 17, 2019

(30) Foreign Application Priority Data

Apr. 17, 2018  (CN) .......................... 2018 1 0345578

(51) Int. Cl.
*H01L 33/48*  (2010.01)
*H01L 33/64*  (2010.01)
(Continued)

(52) U.S. Cl.
CPC .......... *H01L 33/486* (2013.01); *G02B 6/0073* (2013.01); *H01L 33/36* (2013.01); *H01L 33/54* (2013.01); *H01L 33/56* (2013.01)

(58) Field of Classification Search
CPC ..... H01L 25/053; H01L 33/62; H01L 33/486; H01L 33/58; H01L 33/507; H01L 2924/181; H01L 2924/12044; H01L 2924/12041; H01L 2933/0066; H01L 2933/0058; H01L 2224/49113; H01L 25/0753; H01L 2924/1815
See application file for complete search history.

(56) References Cited

U.S. PATENT DOCUMENTS

2006/0255355 A1* 11/2006 Brunner ................ H01L 33/486
                                                        257/98
2010/0308364 A1* 12/2010 Bukesov ................ H01L 33/60
                                                        257/98
(Continued)

FOREIGN PATENT DOCUMENTS

TW        M329862      4/2008
TW        201442300 A  11/2014

*Primary Examiner* — Caridad Everhart
(74) *Attorney, Agent, or Firm* — ScienBiziP, P.C.

(57) ABSTRACT

A narrower LED package structure with sideways output of light suitable for a light guide plate includes two first electrodes, a package body, a cover layer, and two second electrodes. The LED chip is mounted on the first electrodes. The package body encapsulates the first electrodes, and surrounds the LED chip to define a light emitting region. The cover layer infills the light emitting region and covers the LED chip. The second electrodes are positioned outside the package body. Along a plane parallel to the first electrodes, a surface area of the two second electrodes is greater than a surface area of the portion of the two first electrodes positioned in the light emitting region.

7 Claims, 5 Drawing Sheets

(51) Int. Cl.
    *H01L 33/54*     (2010.01)
    *H01L 33/56*     (2010.01)
    *F21V 8/00*     (2006.01)
    *H01L 33/36*     (2010.01)

(56) References Cited

U.S. PATENT DOCUMENTS

2012/0018754 A1*   1/2012   Lowes ...................... F21V 3/12
                                                                      257/98
2015/0021648 A1*   1/2015   Sun ........................ H01L 33/62
                                                                       257/99

\* cited by examiner

SIDE-VIEW LIGHT EMITTING DIODE PACKAGE STRUCTURE

FIELD

The subject matter herein generally relates to light emitting diode (LED) package structure, and particularly relates to a side-view LED package structure.

BACKGROUND

Side-view LED package structures are used in backlight modules of display devices. For such a display device, the side-view LED package structure is positioned at a side of the light guide plate to provide light which is parallel to the light guide plate. However, the display device may have a large size due to the side-view LED package structure.

Therefore, there is room for improvement within the art.

BRIEF DESCRIPTION OF THE DRAWINGS

Implementations of the present disclosure will now be described, by way of example only, with reference to the attached figures.

DETAILED DESCRIPTION

Figure 1:
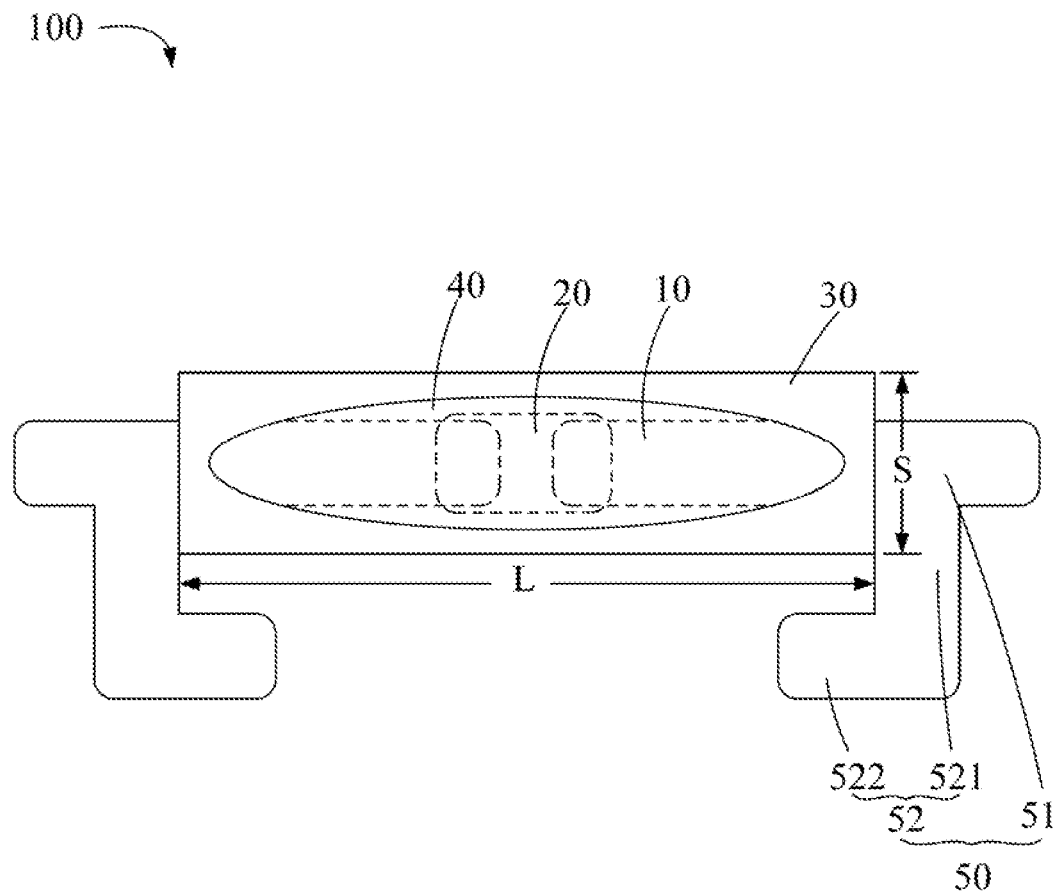
FIG. 1 is a top view of an embodiment of a side-view LED package structure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Figure 2:
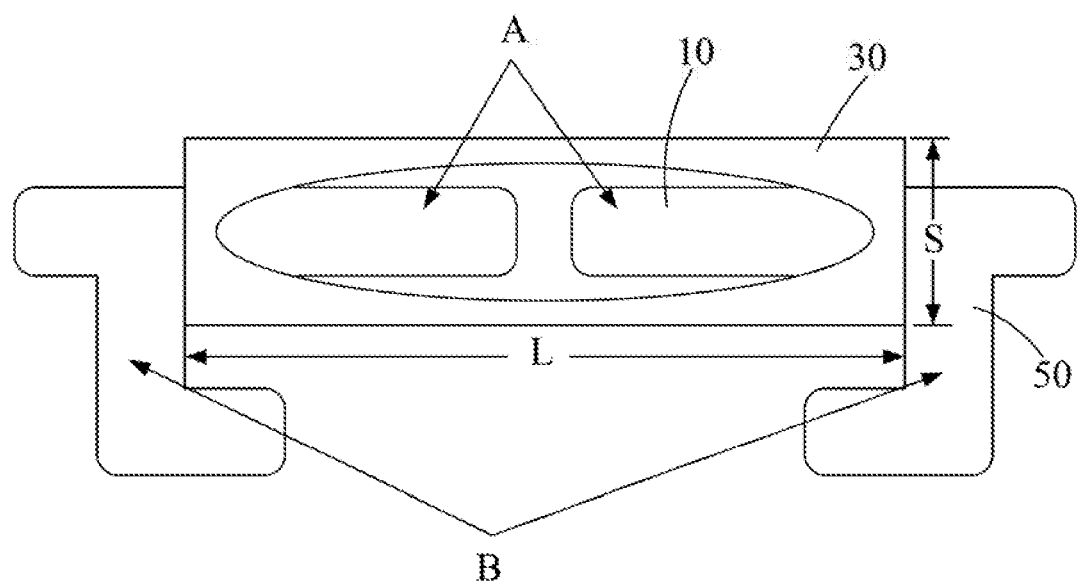
FIG. 2 is a top view of the side-view LED package structure of FIG. 1, omitting an LED chip and a cover layer.
Figure 3:
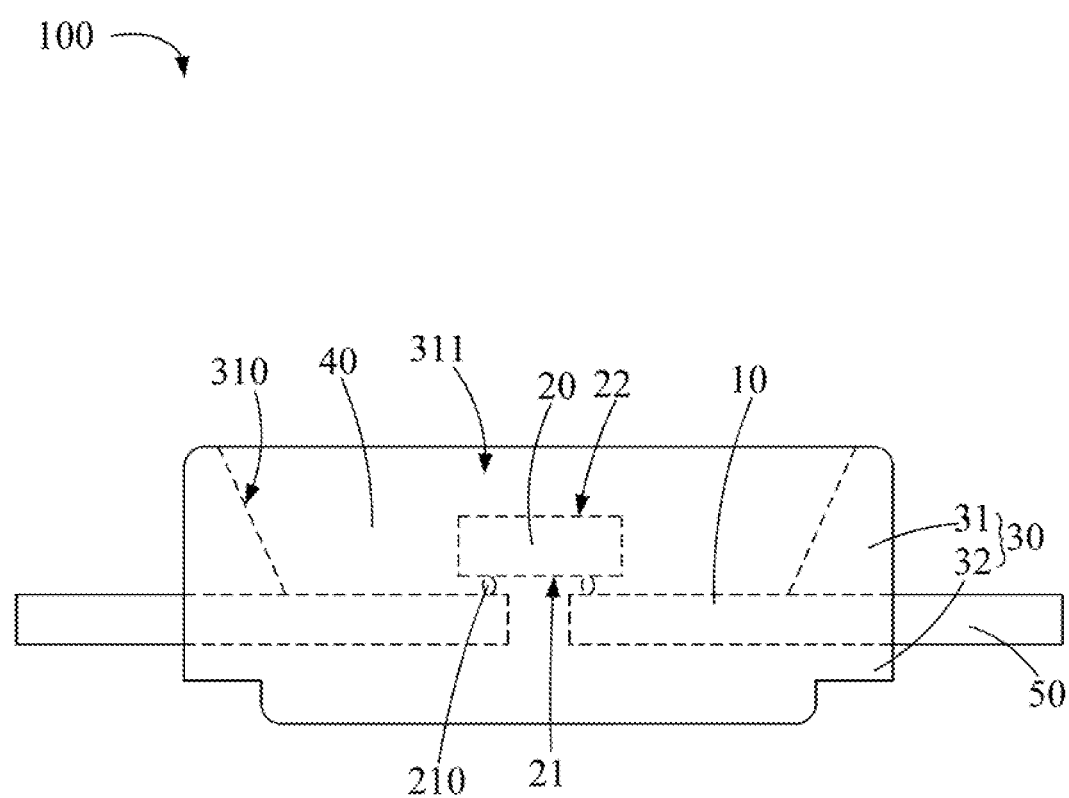
FIG. 3 is a side view of the side-view LED package structure of FIG. 1.

FIGS. 1 to 3 illustrate an embodiment of a side-view LED package structure 100 comprising two first electrodes 10, an LED chip 20, a package body 30, a cover layer 40, and two second electrodes 50. The side-view LED package structure 100 can be manufactured by chip scale package (CSP).

The first electrodes 10 are electrically isolated from each other, and are substantially on the same plane. The first electrodes 10 define a mounting area of the LED chip 20. In an embodiment, the first electrodes 10 are made of highly conductive metal, for example, gold, silver, copper, platinum, aluminum, tin, or nickel.

The LED chip 20 is mounted on the first electrodes 10. The LED chip comprises a bottom surface 21 that is substantially parallel to the first electrodes 10. The bottom surface 21 comprises two bumps 210. The bumps 210 are electrically connected to the first electrodes 10. In an embodiment, the bumps 210 are solder bumps. The LED chip 20 further comprises a light emitting surface 22 facing away from and parallel to the bottom surface 21. The LED chip 20 can emit light through the light emitting surface 22.

The package body 30 encapsulates the first electrodes 10 and surrounds the LED chip 20. In an embodiment, the first electrodes 10 are embedded in the package body 30 by insert molding. The package body 30 comprises an upper package portion 31 positioned on the first electrodes 10, and a lower package portion 32 positioned under the first electrodes 10. The upper package portion 31 defines a receiving groove 310 that passes through the upper package portion 31, to expose a portion of each first electrode 10. A width of the receiving groove 310 is gradually decreased towards the first electrodes 10. The LED chip 20 is received in the receiving groove 310, thereby allowing the receiving groove 310 to define a light emitting region 311 of the LED chip 20. The inner surface of the receiving groove 310 is reflective as to light from the LED chip 20. In an embodiment, a cross section of the package body 30 parallel to the first electrodes 10 comprises two longer sides L and two shorter sides S connected to each other, wherein L>S (see FIG. 2). The package body 30 is made of a transparent material such as silicone rubber or epoxy resin.

The cover layer 40 fills in the receiving groove 310 and covers the LED chip 20. The cover layer 40 can convert the light from the LED chip 20 to light having a desired wavelength. The converted light can then be emitted out through an opening of the receiving groove 310 facing away from the first electrodes 10. The cover layer 40 prevents the LED chip 20 from being polluted by dust and water. In an embodiment, the cover layer 40 comprises a material selected from a group consisting of pomegranate-based phosphor, silicate-based phosphor, sulfide-based phosphor, nitride-based phosphor, and any combination thereof.

The second electrodes 50 are positioned outside the package body 30, and are electrically connected to the first electrodes 10. The side-view LED package structure 100 can be electrically connected to a peripheral device (not shown) through the second electrodes 50. Along a plane parallel to the first electrodes 10, a surface area B of the second electrodes 50 is greater than a surface area A of the portion of the first electrodes 10 positioned in the light emitting region 311 (that is, B>A). In an embodiment, a ratio of the surface area B and the surface area A is about 3:2. The second electrodes 50 are made of highly conductive metal, for example, gold, silver, copper, platinum, aluminum, tin, or nickel.

In an embodiment, the second electrodes 50 and the first electrodes 10 are substantially on the same plane. Each second electrode 50 comprises a connecting portion 51 and an extension portion 52. Each connecting portion 51 is connected to the one first electrode 10. The connecting portion 51 extends from one shorter side S of the package body 30 towards a direction away from the package body 30. Each extension portion 52 comprises a first extension section 521 and a second extension section 522. The first extension section 521 extends from an end of the connecting portion 51 facing away from the package body 30 along a direction parallel to the shorter side S. The second extension section 522 extends from an end of the first extension section 521 facing away from the connecting portion 51 along a direction parallel to the longer side L, and towards the package body 30.

Figure 4:
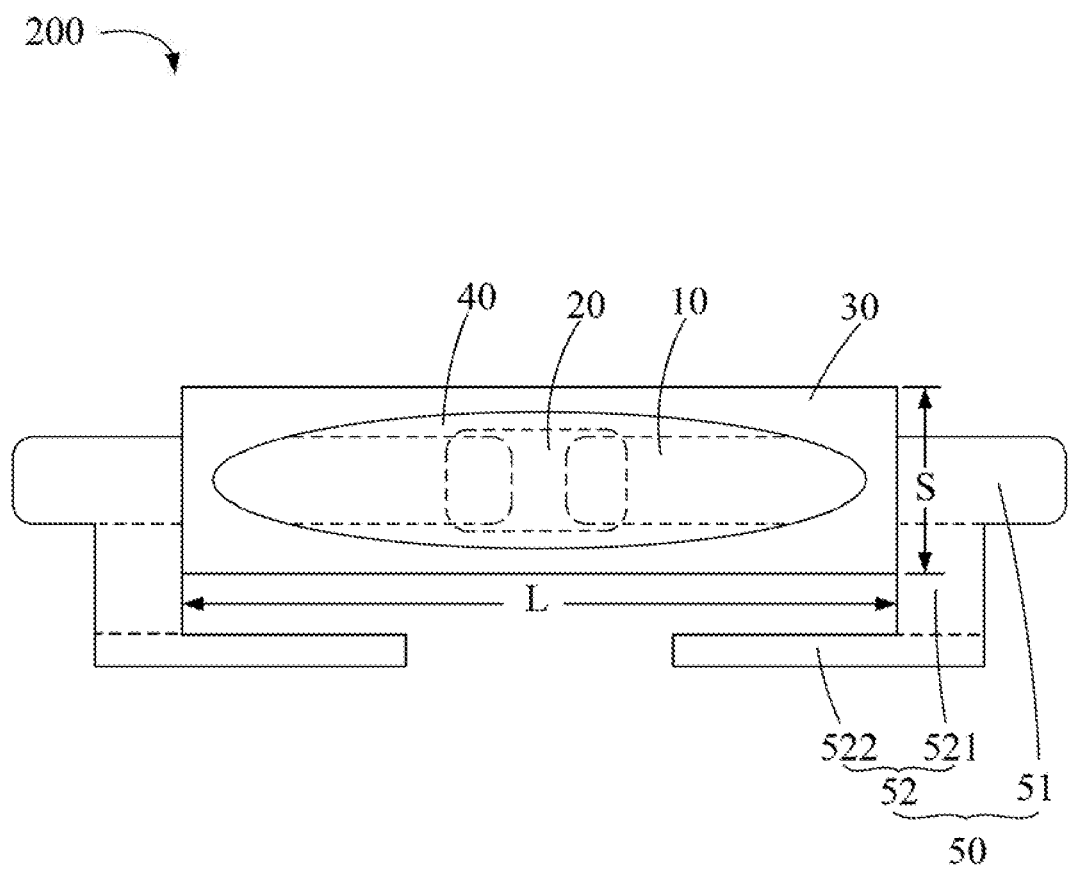
FIG. 4 is a top view of another embodiment of a side-view LED package structure.
Figure 5:
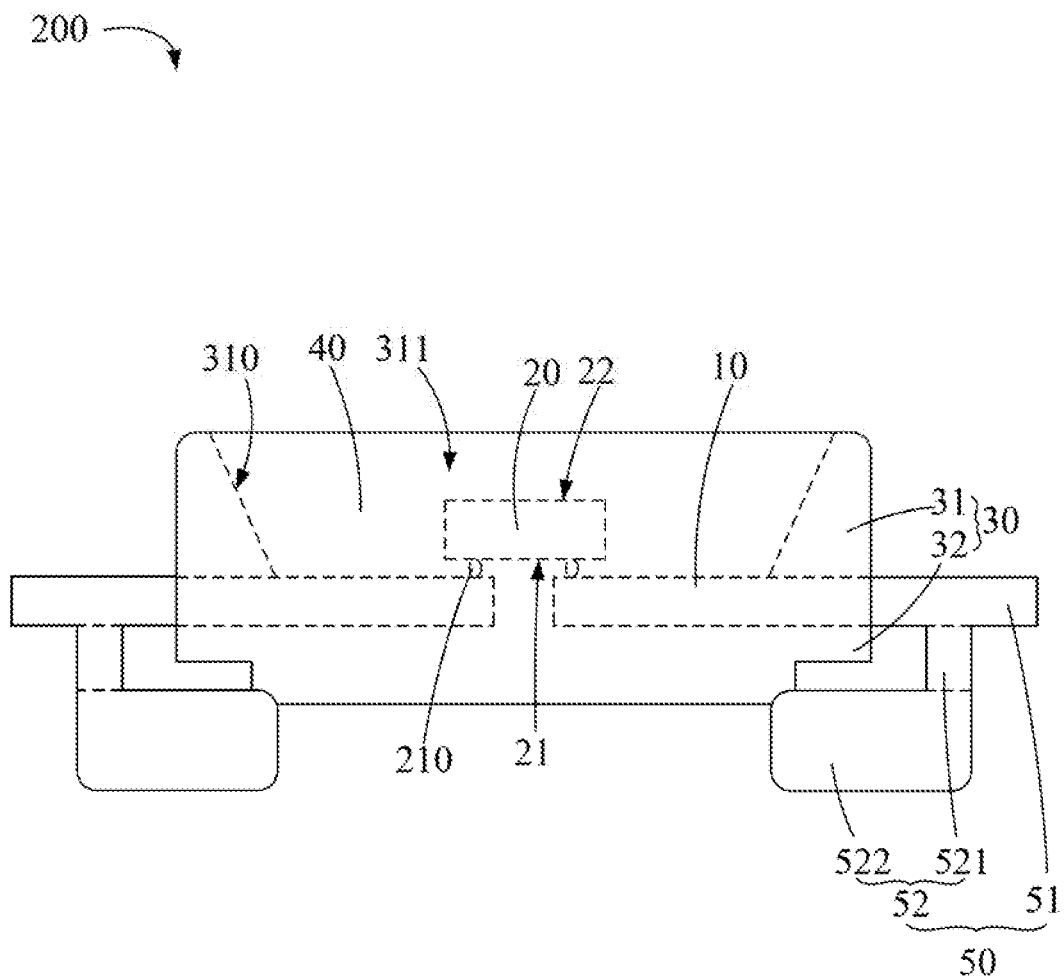
FIG. 5 is a side view of the side-view LED package structure of FIG. 4.

FIGS. 4 and 5 illustrate another embodiment of a side-view LED package structure 200. The second electrodes 50 in the side-view LED package structure 200 are different from those of the side-view LED package structure 10. In detail, the first extension section 521 of the extension portion 52 extends from an end of the connecting portion 51 facing away from the package body 30 along the direction parallel to the shorter side S. The first extension section 521 further extends away from the upper package portion 31 along a direction perpendicular to the first electrodes 10. Thus, the first extension section 521 is bent. The second extension section 522 extends from an end of the first extension section 521 facing away from the connecting portion 51 along the direction parallel to the longer side L and towards the package body 30. The connecting portion 51 and the first electrodes 10 are substantially on the same plane. The extension portion 52 and the connecting portion 51 are on different planes. Thus, the side-view LED package structure 200 is more efficient in outputting light laterally.

Along the plane parallel to the first electrodes 10, the surface area B of the second electrodes 50 is greater than the surface area A of the portion of the first electrodes 10 positioned in the light emitting region 311. Thus, the side-view LED package structures 100, 200 have a smaller light emitting region 311. Then, the size of the package body 30 and the cover layer 40 are decreased, thereby decreasing the overall size of the side-view LED package structures 100, 200.

Even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A side-view light emitting diode (LED) package structure comprising:
    two first electrodes being coplanar;
    an LED chip mounted on and electrically connected to the first electrodes;
    a package body encapsulating the first electrodes, the package body surrounding peripheral sides of the LED chip to define a light emitting region of the LED chip;
    a cover layer filling in the light emitting region and covering the LED chip; and
    two second electrodes positioned outside the package body and electrically connected to the first electrodes, wherein, along a plane parallel to the first electrodes, a surface area of the second electrodes being greater than a surface area of a portion of the first electrodes positioned in the light emitting region;
    wherein a cross section of the package body parallel to the first electrodes comprises two longer sides and two shorter sides connected to each other, each second electrode comprises a connecting portion and an extension portions, each connecting portion is connected to one first electrode, each connecting portion extends from one shorter side towards a direction away from the package body, each extension portion comprises a first extension section and a second extension section, the first extension section extends from an end of the connecting portion facing away from the package body along a direction parallel to the shorter side, the second extension section extends from an end of the first extension section facing away from the connecting portion along a direction parallel to the longer side and towards the package body, the connecting portion, the extension portion, and the first electrodes are on the same plane.

2. The side-view LED package structure of claim 1, wherein a ratio of the surface area of the second electrodes and the surface area of the portion of the first electrodes is 3:2.

3. The side-view LED package structure of claim 1, wherein the package body comprises an upper package portion positioned on the first electrodes and a lower package portion positioned under the first electrodes, the upper package portion defines a receiving groove to expose the portion of the first electrodes, the LED chip is received in the receiving groove, thereby allowing the receiving groove to define the light emitting region of the LED chip, the cover layer fills in the receiving groove.

4. The side-view LED package structure of claim 3, wherein a width of the receiving groove is gradually decreased towards the first electrodes.

5. The side-view LED package structure of claim 1, wherein the LED chip comprises a bottom surface that is parallel to the first electrodes, the bottom surface comprises two bumps that are electrically connected to the first electrodes.

6. The side-view LED package structure of claim 1, wherein the first electrodes are made of one of gold, silver, copper, platinum, aluminum, tin, and nickel.

7. The side-view LED package structure of claim 1, wherein the second electrodes are made of one of gold, silver, copper, platinum, aluminum, tin, and nickel.

* * * * *